United States Patent [19]
Sivan

[11] Patent Number: 5,198,683
[45] Date of Patent: Mar. 30, 1993

[54] INTEGRATED CIRCUIT MEMORY DEVICE AND STRUCTURAL LAYOUT THEREOF

[75] Inventor: Richard D. Sivan, Austin, Tex.

[73] Assignee: Motorola, Inc., Schaumburg, Ill.

[21] Appl. No.: 695,053

[22] Filed: May 3, 1991

[51] Int. Cl.[5] .................... H01L 27/02; H01L 29/10; H01L 29/06

[52] U.S. Cl. .................... 257/67; 257/331; 257/333; 257/351; 257/377; 257/393; 257/395; 257/622; 257/653; 257/756; 257/903

[58] Field of Search ............ 357/42, 23.7, 23.4, 357/23.11, 44.71; 365/182, 181, 180, 154, 156, 189.08, 189.11; 437/48

[56] References Cited

U.S. PATENT DOCUMENTS 5,016,070 5/1991 Sundaresan .................... 357/23.7

OTHER PUBLICATIONS

R. Eklund et al., "A 0.5 um BICMOS Technology For Logic and 4MBit-Class SRAMS's," IEDM Proceedings 1989, pp. 425-428.

T. E. Tang et al., "VLSI Local Interconnect Level Using Titanium Nitride," IEDM Proceedings 1985, pp. 590-593.

*Primary Examiner*—Jerome Jackson, Jr.
*Assistant Examiner*—Ngan V. Ngo

[57] ABSTRACT

A memory cell layout achieves a reduced cell area. In one embodiment, a six transitor (6T) SRAM cell has two vertical thin-film transistors (18 and 20) as load transistors, two transfer transistors (10 and 12), two latch transistors (14 and 16), and two storage nodes. NODE 1 and NODE 2 of the cell each have a minimum feature defined by trenches (60). Four of five interconnects associated with each node are located within the respective trench. For example in NODE 1, a drain of latch transistor (14), a gate of latch transistor (16), a drain of load transistor (18), and a current electrode of transfer transistor (10) are electrically coupled within or beneath one trench (60). A remaining interconnection of NODE 1, a gate of load transistor 20, is located within the trench associated with NODE 2. Thus, ten interconnects of the memory cell are contained within areas defined by two minimum features.

25 Claims, 7 Drawing Sheets

INTEGRATED CIRCUIT MEMORY DEVICE AND STRUCTURAL LAYOUT THEREOF

CROSS-REFERENCE TO A RELATED APPLICATION

The present application is related to a commonly assigned co-pending patent application by Sivan entitled, "A SELF-ALIGNED VERTICAL THIN-FILM TRANSISTOR IN A SEMICONDUCTOR DEVICE AND METHOD FOR MAKING THE SAME," filed May 3, 1991 Ser. No. 07/695,129, and herein incorporated by reference.

TECHNICAL FIELD OF THE INVENTION

The present invention is related to integrated circuits in general, and more specifically to integrated circuit memory devices and memory device layouts.

BACKGROUND OF THE INVENTION

Integrated circuit (IC) memory devices are made up of a plurality of memory cells. In general, one basic memory cell design is duplicated numerous times to form the plurality of cells. The basic cell design may be modified slightly from cell to cell, for example one cell may be a reversed image or complement of an adjacent cell, but the entire memory device can be described according to the basic cell design.

In the case of SRAM (static random access memory) devices, the basic cell is usually in one of two forms, either a six transistor (6T) cell or a four transistor/2 resistor (4T/2R) cell. Many conventional SRAMs using a 6T configuration have six transistors formed in a bulk semiconductor substrate such as single crystal silicon. This type of SRAM is often fabricated in CMOS (complementary metal oxide semiconductor) technology, four of the transistors being n-channel devices while the remaining two transistors are p-channel devices. The 6T configuration offers several advantages, one being that the device operates at a low level of power. Another advantage is that bulk transistors have good electrical characteristics, including high mobility and low threshold voltages. Furthermore, 6T SRAMs are considered to be very stable, having high immunity to cell upsets such as soft errors caused by incident alpha particles. Unfortunately 6T SRAM cells utilizing transistors formed in a bulk substrate consume a large area because the transistors are formed next to one another in the substrate and are essentially in the same plane. Thus, the use of six bulk transistors imposes an unnecessary lower limit on the cell size for a particular generation of technology. Achieving the smallest cell size is advantageous from a manufacturing cost point view in order to increase memory capacity without increasing the overall device size.

A reduction in cell area in comparison to the bulk 6T cell area can be achieved by using the 4T/2R configuration. Cell area is able to be reduced because only four transistors are formed next to one another in a bulk substrate. The four bulk transistors are most often n-channel devices, but may also be p-channel devices enabling the SRAM to be fabricated in either NMOS or PMOS technology. Two resistors which function as load elements are formed above the four bulk transistors, thereby requiring at least one additional conductive layer. A disadvantage with implementing a 4T/2R cell design is that fabrication complexity is increased in comparison to a bulk 6T SRAM as a result of the additional conductive layer. The additional conductive layer requires at least two more masking steps and also creates a more severe topography on the device. As the topography becomes more severe it becomes more difficult to contact metallization layers, such as bit line metal, to areas within the cell. Besides an increase in fabrication complexity, 4T/2R SRAM configurations have another disadvantage over 6T SRAM configurations. The two load resistors in a 4T/2R SRAM are passive elements whereas the two load transistors in a 6T SRAM are active elements. The load resistors are passive because the amount of current the resistors can supply to a transistor within the cell is fixed, regardless of the amount of current necessary to store and retain information in a node of the cell. If the current supplied by a resistor is less than that needed to maintain a logic state, the cell is unstable and susceptible to information loss. Load transistors, on the other hand, are able to vary the amount of current being supplied to a node to meet demand, and therefore will normally be able to maintain the node's logic state absent any defects in the cell. Yet another disadvantage with the 4T/2R SRAM design is that the cell requires a relatively high level of power because resistors continuously draw current rather than drawing current only as needed.

A compromise between the advantages and disadvantages of the bulk 6T cell and the 4T/2R cell is the use of a 6T/TFT load SRAM cell. As the name suggests, this type of cell utilizes TFTs (thin-film transistors) as load transistors. TFTs, sometimes referred to as polysilicon transistors, are transistors in which both current electrodes and control electrode (i.e. the source, drain, and gate) are each made of a material other than the substrate material, for example polysilicon. The complete 6T/TFT load SRAM cell includes four bulk transistors, usually n-channel devices, and two TFT load transistors which are usually p-channel devices. The two passive load resistors in a 4T/2R cell are replaced in a 6T/TFT load cell by the two TFT load transistors. Thus, the 6T/TFT load SRAM has all the advantages of having active load elements. Although TFTs typically do not have electrical characteristics as good as those of bulk transistors, the area savings is considered by many to outweight electrical disadvantages. The size of a 6T/TFT load SRAM cell is comparable to that of a 4T/2R cell, yet the use of two load transistors results in a much more stable cell than a cell which employs resistors. Power consumption of a 6T/TFT load SRAM is higher than that of the bulk 6T device, but considerably lower than power consumption of the 4T/2R device.

Overall, the 6T/TFT load SRAM is considered to have better electrical performance than a 4T/2R SRAM while maintaining a favorably sized cell. However, there is always a need to reduce cell size further in order to achieve increased memory capacity without an increase in device size. Therefore, a need exists for an improved integrated circuit memory device, and more specifically for an improved integrated circuit memory device and a structural layout thereof in which cell size is reduced over existing memory cells.

BRIEF SUMMARY OF THE INVENTION

The above need is fulfilled and other advantages are achieved with the present invention. An integrated circuit memory device and a structural layout for such a device are provided. In one form, the structural layout has an array of memory cells. At least one cell of the array has a plurality of transistors, at least one data storage node, a minimum feature, and an enclosed area defined by a perimeter of the minimum feature. The enclosed area of the layout is comprised of an active region which functions as a current electrode of a first transistor and a first interconnect means overlapping a portion of the active region. The enclosed area is also comprised of a first conductive material which forms a control electrode of a second transistor and overlaps a portion of the first interconnect means to couple the control electrode of the second transistor to the active region. A second interconnect means overlaps a portion of the first conductive material and defines the enclosed area. A second conductive material of the enclosed area overlaps the second interconnect means, couples the second conductive material to the first conductive material, and functions as current electrodes of the third transistor. The enclosed area also comprises a third conductive material which forms a control electrode of the third transistor and which is contained within the second interconnect means.

DETAILED DESCRIPTION OF A PREFERRED EMBODIMENT

The present invention provides a substantial reduction in cell area of a memory device. As an example, a 6T/TFT load SRAM cell and layout in accordance with the present invention achieves a 30-40% reduction in cell area over conventional 6T/TFT load cells and comparably sized 4T/2R SRAM cells, such as those implemented in 0.5 μm CMOS technology. The size reduction is attributable to the utilization of vertically oriented load transistors rather than more commonly used planar transistors. Cell area is also reduced because most of the transistor interconnects are confined to a small area within the cell which is defined by a minimum feature size.

Figure 1:
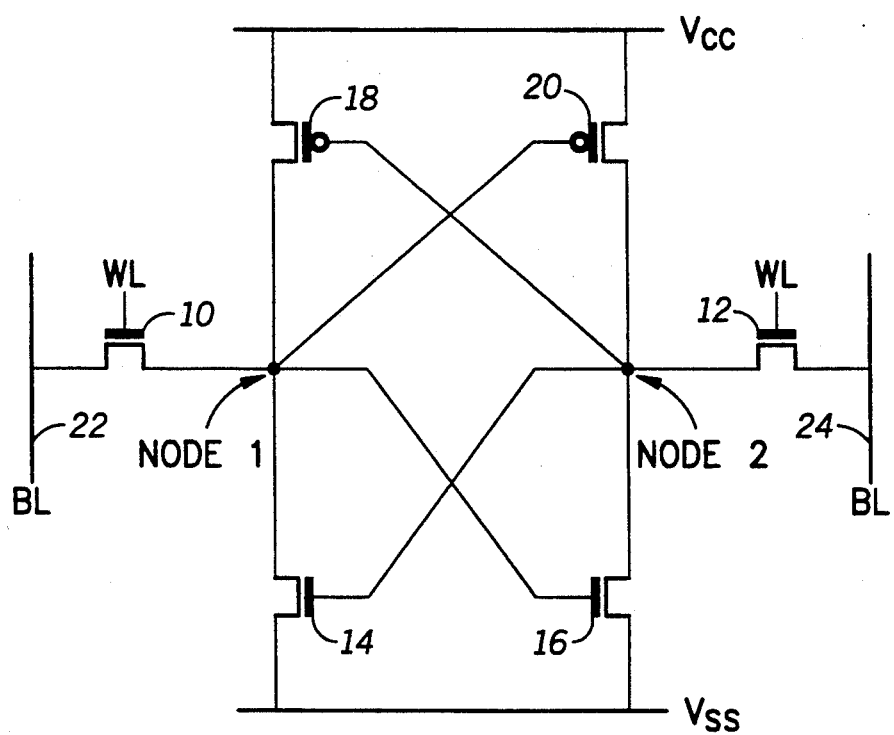
FIG. 1 is a circuit diagram of a conventional 6T (6 transistor) SRAM device.

Illustrated in FIG. 1 is a circuit diagram for a conventional 6T SRAM cell. The operation of the cell is also conventional and is not relevant to the present invention. For this reason, operation of the illustrated SRAM cell will not be described. The SRAM cell is comprised of six transistors: two transfer transistors 10 and 12, two latch transistors 14 and 16, and two load transistors 18 and 20. The six transistors are electrically coupled to form two data storage nodes, labeled in FIG. 1 as NODE 1 and NODE 2. NODE 1 electrically couples a drain of latch transistor 14, a gate of latch transistor 16, a gate of load transistor 20, a drain of load transistor 18, and one of two current electrodes of transfer transistor 10 (either a source of drain depending on whether a "high" or "low" data state has been stored in the cell). NODE 2 is the complement of NODE 1 and electrically couples a drain of latch transistor 16, a gate of latch transistor 14, a gate of load transistor 18, a drain of load transistor 20, and one of two current electrodes (either the source of drain) of transfer transistor 12. A source electrode of each of load transistors 18 and 20 is coupled to a power supply labeled $V_{cc}$, while a source electrode of each of latch transistors 14 and 16 is coupled to a power supply labeled $V_{ss}$. In the illustrated form, $V_{cc}$ is more positive than $V_{ss}$. Bit lines 22 and 24, labeled BL, are coupled to a current electrode of transfer transistors 10 and 12, respectively.

The conventional SRAM schematic illustrated in FIG. 1 may be implemented using a structural layout and memory cell in accordance with the present invention. The terms latch transistor, transfer transistor, load transistor, data storage node, and others which were used to describe the SRAM cell discussed above will also be used throughout the description of the present invention.

FIGS. 2A-2D illustrate a structural layout of a memory device cell which utilizes two vertical TFT load transistors in accordance with the invention. For clarity purposes, the layout is illustrated in a sequence of illustrations rather than in complete form. One skilled in the art should be able to fully comprehend the present invention by reviewing the layout illustrated in FIGS. 2A-2D along with corresponding cross-sectional illustrations of the cell which are illustrated in FIGS. 3A and 3B. FIG. 3A is an illustration of the memory cell taken along the line 3A—3A of FIGS. 2A-2D. FIG. 3B illustrates the same cell taken along the line 3B—3B. It is important to note that while each of the figures of the present application illustrate a single memory cell, one skilled in the art should be able to implement the present invention in a memory device having a plurality of similar cells.

Figure 2A:
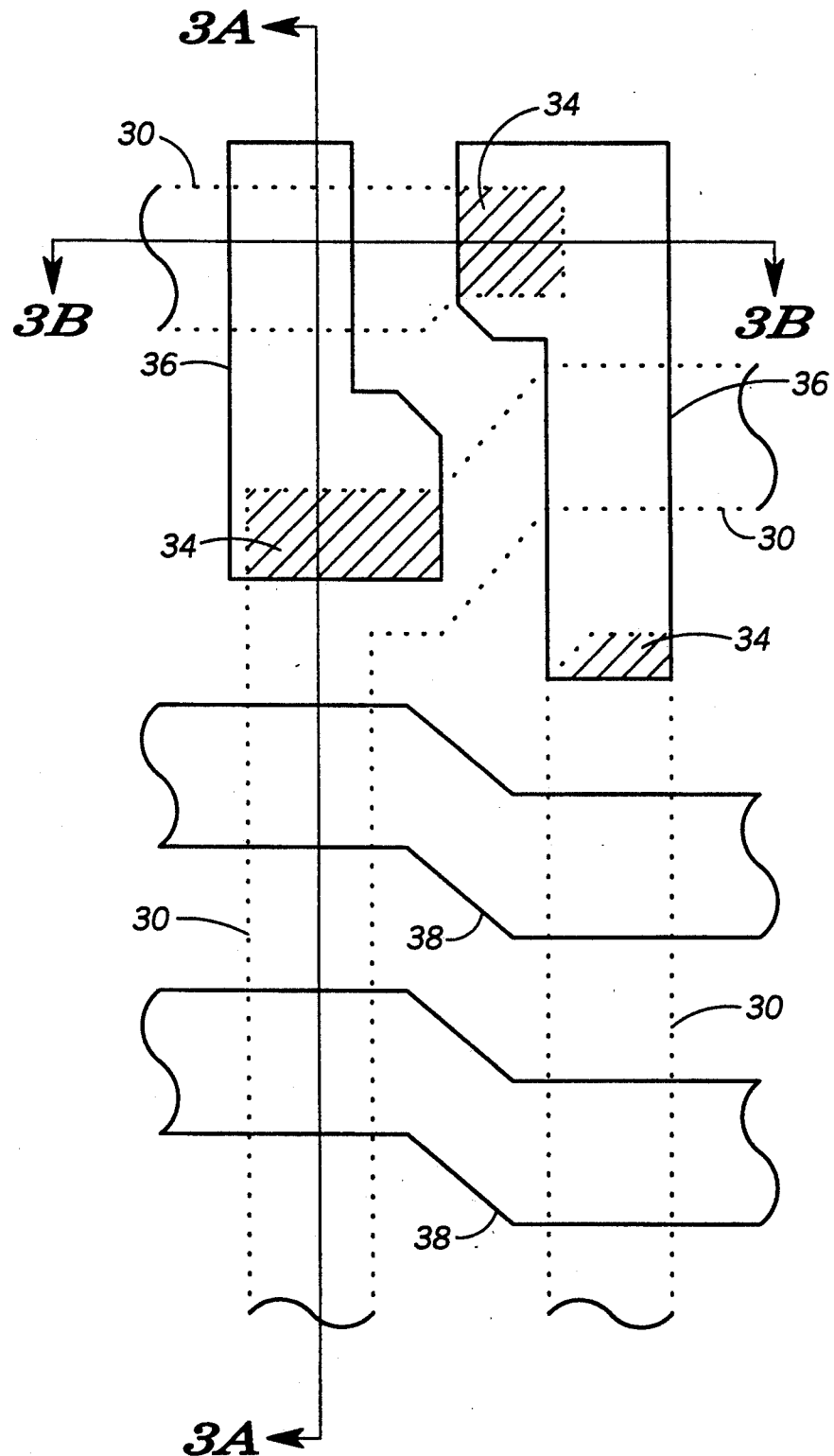
FIGS. 2A-2D represent a structural layout, illustrated in sequence for clarity, for a memory device in accordance with the present invention.
Figure 3A:
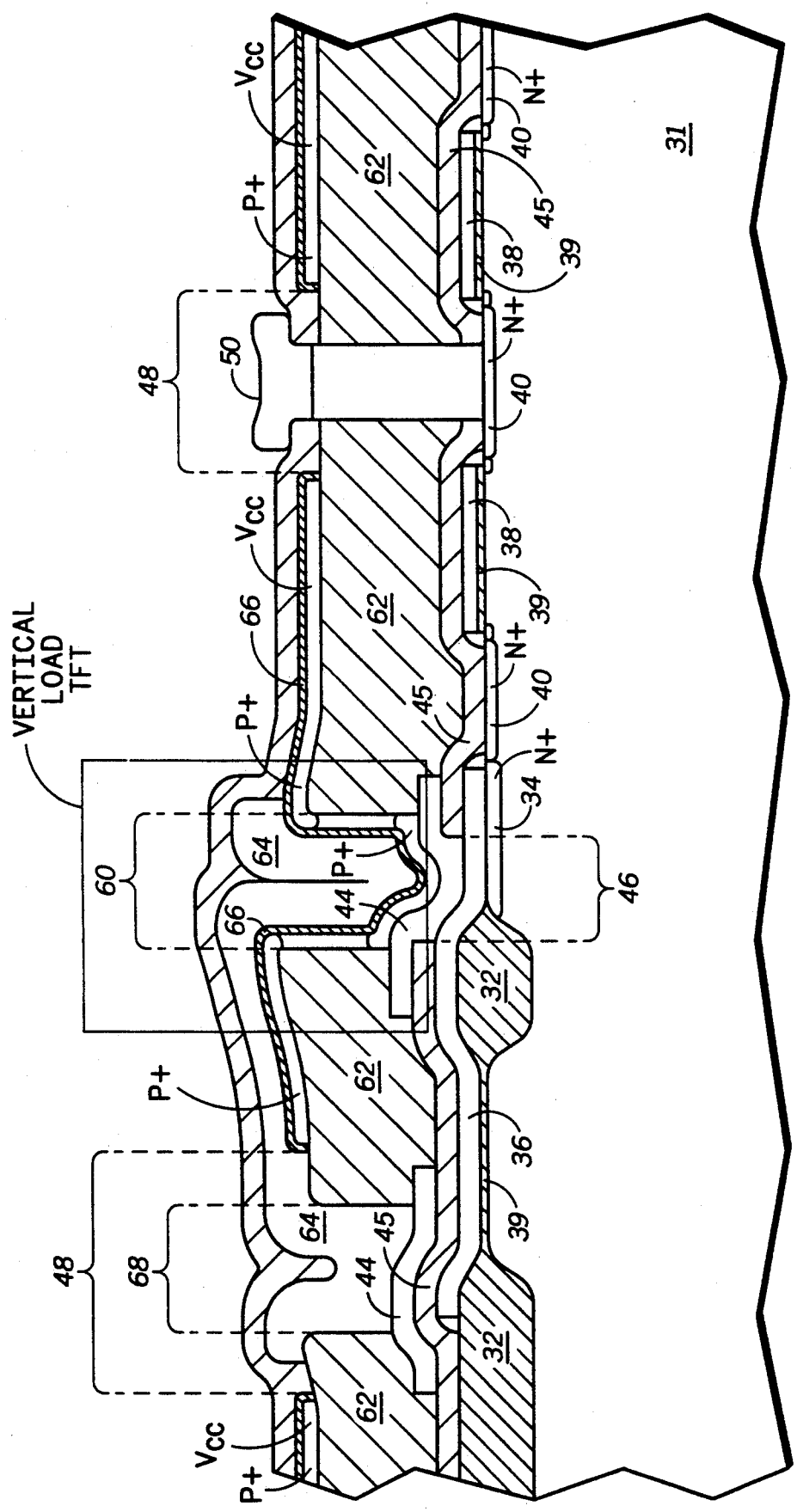
FIGS. 3A and 3B are cross-sectional illustrations of an integrated circuit memory device in accordance with the present invention formed using the layout illustrated in FIGS. 2A-2D.
Figure 3B:
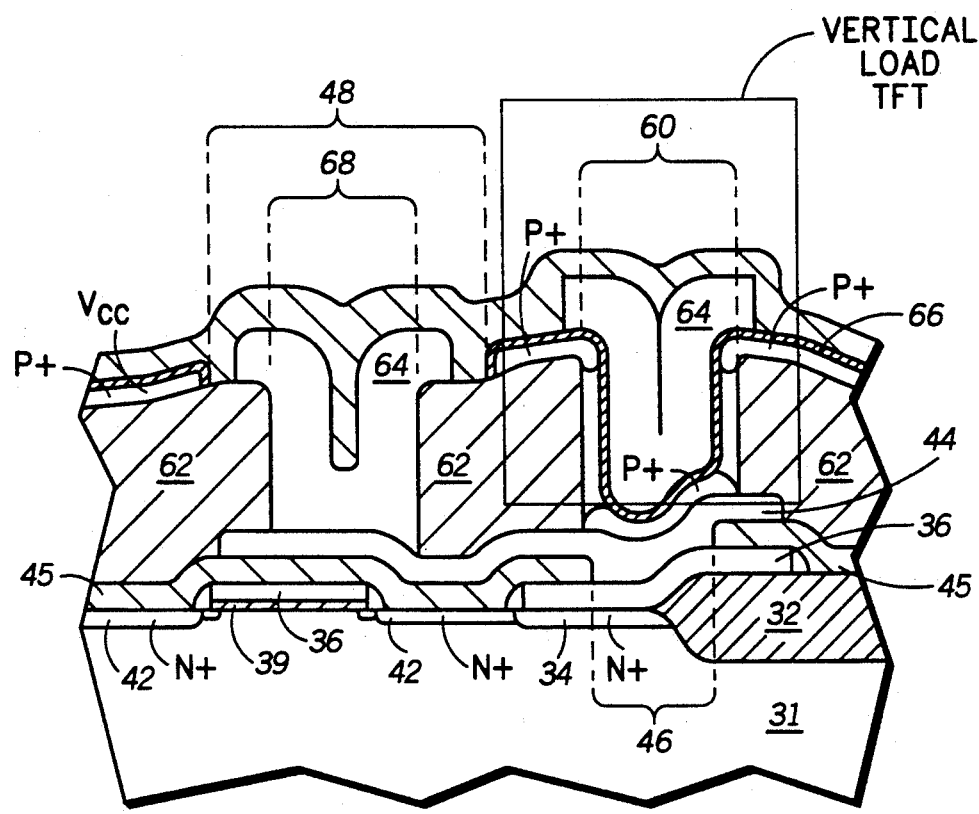

FIG. 2A illustrates three layers of the memory cell layout. The layout defines active regions 30, regions within the dotted lines, which are areas formed in a semiconductor substrate which usually define source, drain, and channel regions of a transistor. Areas of the cell outside of the active regions 30 are field regions which are usually defined by a field oxide. For example with reference to FIGS. 3A and 3B, field oxide regions 32 are formed in a substrate 31. Substrate 31 is usually a single crystal silicon substrate but may instead be of another semiconducting material, such as a Group III-V or a Group II-VI semiconductor compound. Field oxide regions are formed in a known manner, such as a LOCOS (localized oxidation of silicon) process. Regions of the substrate in which field oxide has not been formed are considered to be active regions, i.e. regions in which active devices are formed.

Also illustrated in FIG. 2A is a layer which defines buried contacts 34. The buried contacts are represented in the figure by cross-hatched areas. Buried contacts 34 are heavily doped regions formed in the substrate used to electrically interconnect elements of the memory cell. SRAMs usually employ n-channel bulk transistors, thus buried contacts 34 of FIGS. 3A and 3B are N+ regions. P+ buriedcontacts may instead be used if the application permits. A suitable alternative to forming buried contacts in the present invention is the use of one of the various local interconnect structures, also called straps, known in the industry. An example of a local interconnect structure which may be used in accordance with the present invention is described in an article entitled, "VLSI Local Interconnect Level Using Titanium Nitride," by T. E. Tang et al., *IEDM Technical Digest* 1985, pp. 590–593.

A third layer illustrated in FIG. 2A is a first conductive layer defining first conductive regions 36 and first conductive regions 38. The first conductive layer is illustrated as a solid line in the figure. Although the first conductive layer may be of any electrically conducting or semiconducting material, a preferred material is polysilicon. For this reason, first conductive regions 36 and 38 are hereafter referred to as first polysilicon regions 36 and 38. As FIGS. 3A and 3B illustrates, first polysilicon regions 36 function as control electrodes or gates of two latch transistors within the memory cell. First polysilicon regions 38, on the other hand, are control electrodes of two transfer transistors, the rightmost transfer transistor being part of an adjacent cell (not shown). Both the latch transistors and the transfer transistors are bulk transistors formed in the cell using known technology.

After forming first polysilicon regions 36 and 38, current electrodes to the two latch transistors and two transfer transistors are formed. Current electrodes 40 of the transfer transistors appear in FIG. 3A, while current electrodes 42 of the latch transistors are illustrated in FIG. 3B. Current electrodes 40 and 42, also known as source and drain electrodes of the transistors, are heavily doped regions formed in substrate 31. FIGS. 3A and 3B illustrate that first polysilicon regions 36 and 38 are isolated from active regions of substrate 31 in a conventional manner by a gate dielectric 39. One exception to this isolation is the location in the cell where first polysilicon regions 36 overlie buried contacts 34. Buried contacts 34 function as interconnects to electrically couple first polysilicon regions 36 (control electrodes of the two latch transistors) to various current electrodes of the bulk transistors within the cell. To more easily determine which current electrodes of the latch and transfer transistors are coupled to first polysilicon regions 36 (i.e. the latch transistor gates), the reader is directed to the circuit diagram in FIG. 1.

Figure 2B:
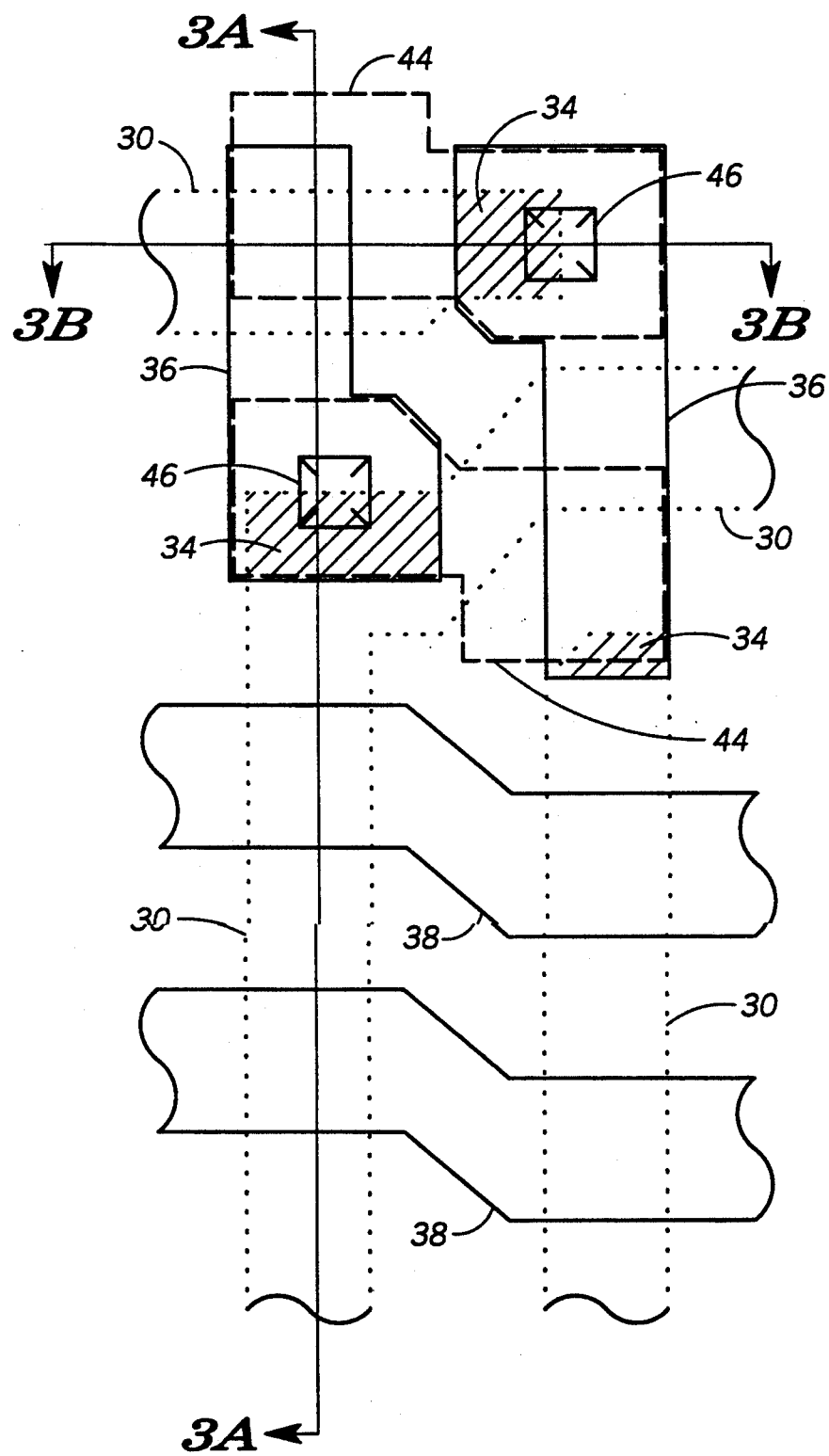

Additional layers of the cell layout are illustrated in FIG. 2B. A second conductive layer is represented by dashed lines and defines two conductive landing pads 44. Again, a preferred material for landing pads 44 is polysilicon although other conductive and semiconductive materials may also be used. Polysilicon landing pads 44 are used as interconnects between a third conductive layer (not shown in FIG. 2B, see FIG. 2C) and the first conductive layer, and therefore are electrically coupled to the first polysilicon layer. Electrical connection is achieved by providing through-holes 46. In reference to FIGS. 3A and 3B, through-holes 46 are openings formed in a dielectric layer 45. Dielectric layer 45 serves to isolate the first polysilicon layer from overlying conductive layers within the cell, except in the areas where through-holes 46 are formed. In the layout of FIG. 2B, through-holes 46 are illustrated as essentially square structure. However, it is important to note that the shape of through-holes 46 is not limited in the present invention. Other suitable shapes for through-holes 46 include rectangular and circular. The second conductive layer overlies through-holes 46 such that polysilicon landing pads 44 are in contact with first polysilicon regions 36.

Figure 2C:
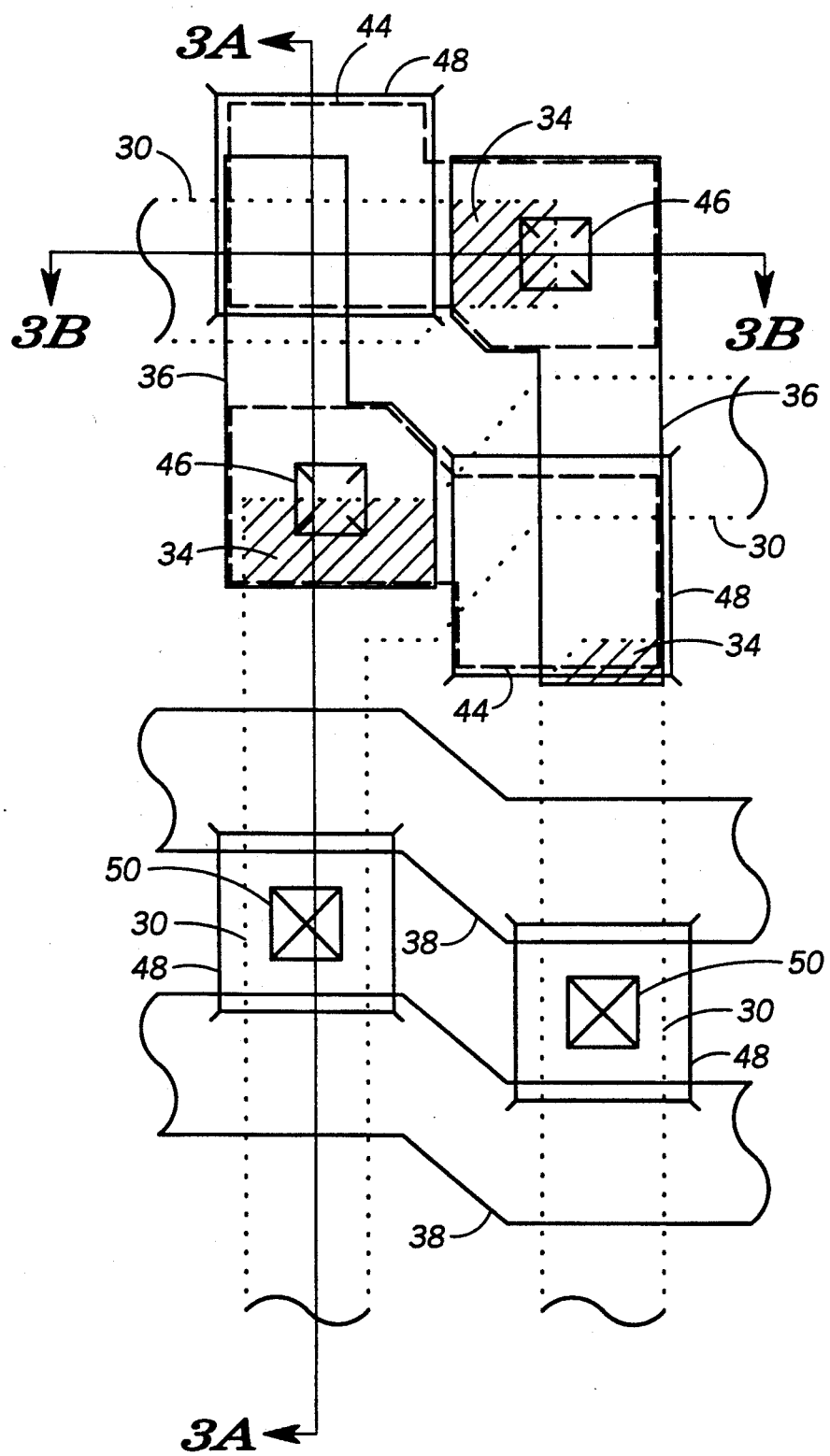

A third conductive layer is also included in the memory cell and cell layout; however, the third conductive layer is not fully illustrated. Instead, FIG. 2C illustrates where the third conductive layer is not, i.e. the figure illustrates a negative image of the third conductive layer. Openings 48 are openings within the third conductive layer indicating that the third conductive material is not present in the region inside the openings. As in the previous conductive layers, the third conductive material is also preferably polysilicon, although other materials may also be used in accordance with the present invention. The third polysilicon layer has two purposes. One purpose of the third polysilicon layer is to function as a $V_{cc}$ bus. Therefore, it is desirable to have the third polysilicon layer to cover as much area of the cell as possible in order to create a uniform $V_{cc}$ signal with low resistance in the cell. However, openings 48 are necessary in the third polysilicon layer so that bit line contacts 50 can be made to underlying transfer transistors. Bit lines are usually formed of a metallization layer, such as tungsten or aluminum, which physically lies above each of the polysilicon layers. In order for the bit lines to contact the underlying bulk transistors, openings must be provided in the third conductive layer, i.e. in the $V_{cc}$ layer. FIGS. 3A and 3B both illustrate openings 48 and the $V_{cc}$ layer. Openings 48 are also provided to permit an interconnection between a fourth conductive layer (not shown in FIG. 2C, see FIG. 2D) and landing pads 44, the purpose of which will be addressed later.

Figure 2D:
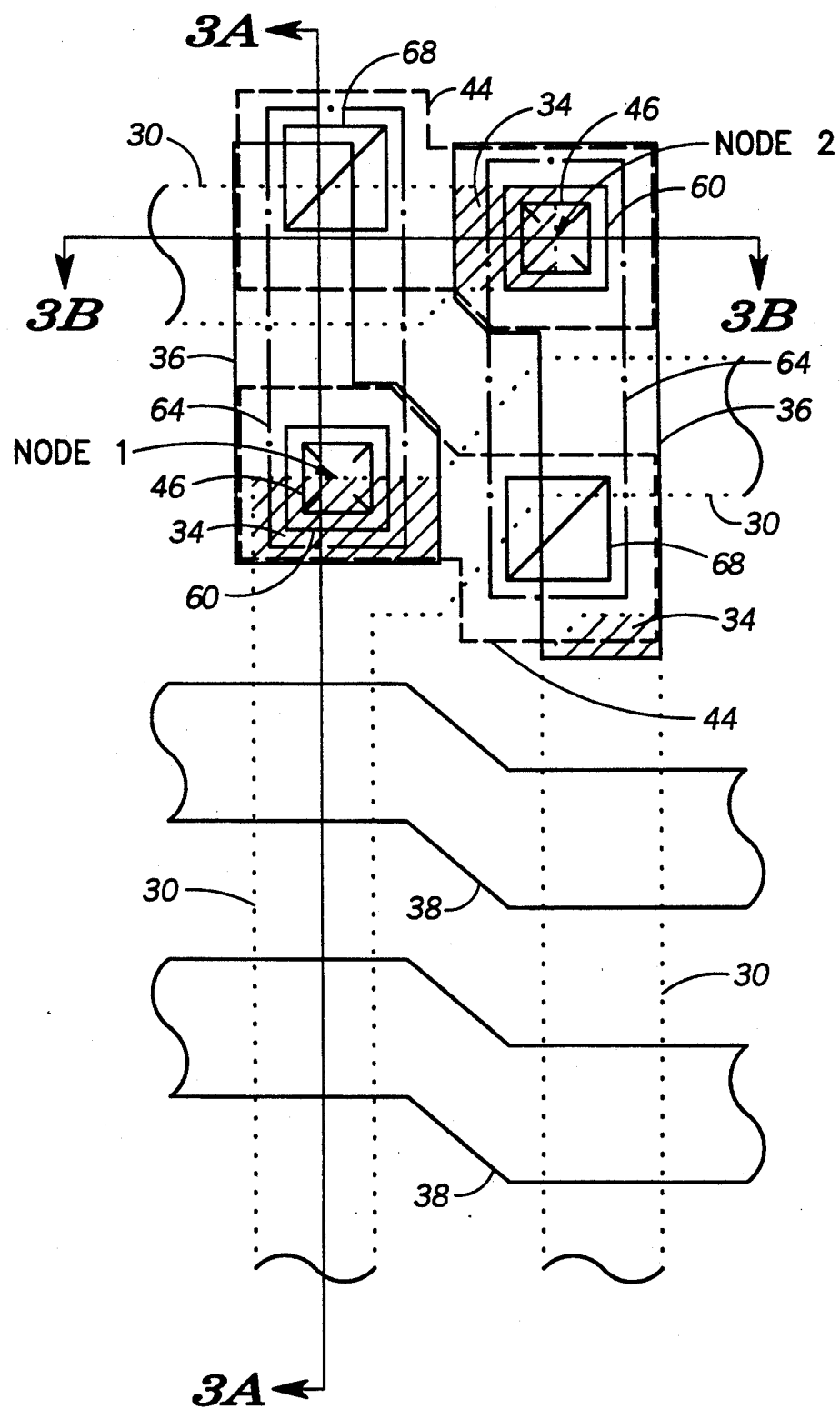
Figure 3C:
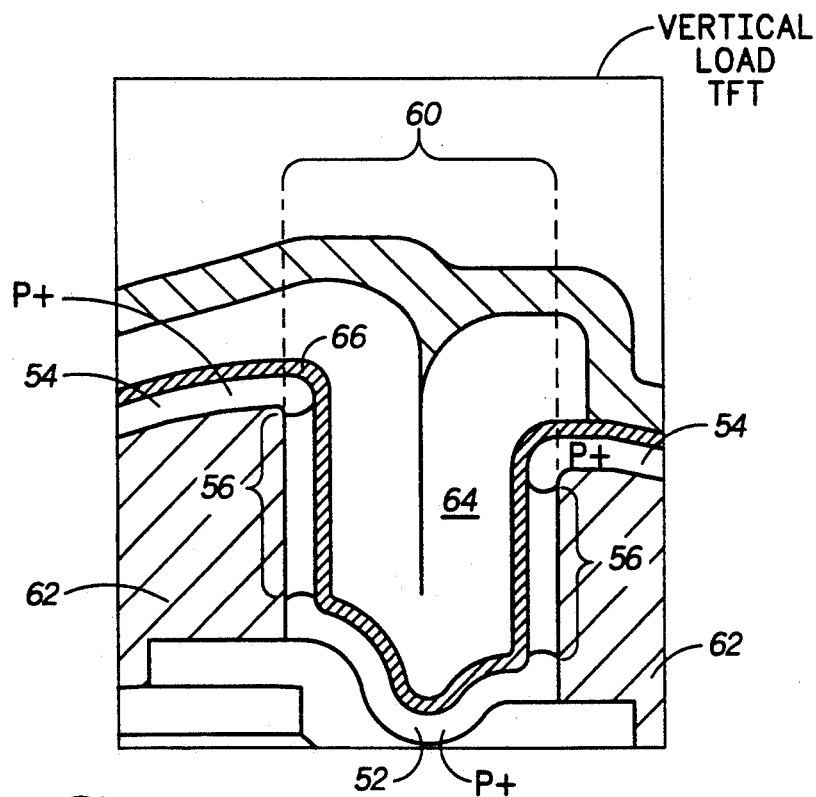
FIG. 3C is a magnified cross-sectional view of a vertical TFT load as illustrated in FIGS. 3A and 3B.

A second purpose of the third polysilicon layer is to form first and second current electrodes and a channel region in two vertical load TFT transistors. The two vertical load TFTs are illustrated in FIGS. 3A and 3B. FIG. 3C illustrates a more magnified and detailed image of each of the load transistors. Each of the vertical load transistors is located within a trench 60 which is formed prior to depositing the third polysilicon layer. Trenches 60 are not illustrated in FIG. 2C for purposes of clarity; however, the trenches are illustrated in FIG. 2D and in each of the cross-sectional figures. A more detailed explanation of how trenches 60 are formed appears below. The third conductive layer forms a first current electrode 52 which functions as a drain electrode of the vertical load transistor. A second current electrode 54 functions as a source electrode of the transistor. Both the first current electrode 52 and the second current electrode 54 are formed from the third conductive layer, preferably polysilicon, which is also used as the $V_{cc}$ bus material. The third polysilicon layer also forms channel regions 56 which join the first and second current electrodes. The load transistors of the cell are p-channel devices, as in most memory devices which employ bulk n-channel transistors. However, it should be understood that the load transistors may be made as n-channel transistors if the four bulk transistors are p-channel devices.

Each of the load transistors are located within a trench 60 which is formed in a dielectric layer 62, as illustrated in FIG. 3C. Dielectric layer 62 may be deposited onto the device following the second polysilicon layer. Suitable dielectrics include PSG (phosphosilicate glass), LTO (low temperature oxide), TEOS (tetra-ethyl-ortho-silicate), or the like, and may be deposited using known deposition techniques. The thickness of dielectric layer 62 will determine the length of channel region 56, therefore deposition of the layer should be controlled accordingly. To form the trench, dielectric layer 62 is anisotropically etched after non-trench portions of the layer are masked. The etch chemistry used can be chosen such that the etch attacks the dielectric layer but does not attack any underlying polysilicon layers. For instance, landing pads 44 may be used as an etch stop material during formation of the trenches. For a more complete description of the structure and formation of the vertical load transistors, the reader is directed to a co-pending patent application, filed May 3, 1991, Ser. No. 07/695,129, entitled, "A SELF-ALIGNED VERTICAL THIN-FILM TRANSISTOR IN A SEMICONDUCTOR DEVICE AND METHOD FOR MAKING THE SAME," by Sivan, assigned to the assignee hereof and herein incorporated by reference.

Referring to the layout illustrated in FIG. 2D, trenches 60 completely encompass through-holes 46; however, this is not a requirement of the present invention. Notice that the trenches also overlie or overlap portions of each of the previously described layers, namely the active region layer, the buried contact layer, the first polysilicon layer, the second polysilicon layer, the through-hole layer which interconnects first and second polysilicon, and the third polysilicon layer. Having each of these layers located within the area defined by trenches 60 leads to a compact interconnect structure, resulting in a very compact cell size. The interconnect structure will be discussed in more detail at a later point in the description of the present invention.

FIG. 2D also illustrates a fourth conductive layer, represented by the combined dotted and dashed line, which completely overlaps trenches 60. (For clarity purposes, the third conductive layer is not illustrated in FIG. 2D). As FIGS. 3A and 3B illustrate, the fourth conductive layer, or fourth polysilicon layer, forms a control electrode or a gate 64 to each of the vertical load transistors. It is important to note that the fourth polysilicon layer need not completely fill trenches 60. Partial overlapping of the fourth conductive layer, trenches 60 and through-holes 46 may also enable the fourth conductive layer to form gate 64. FIG. 3C illustrates in more detail that gate 64 is separated from the first and second current electrodes, 52 and 54 respectively, by a gate dielectric 66. The gate completely fills trench 60 and extends above dielectric layer 62 to a through-hole 68 illustrated in FIGS. 3A and 3B. Through-hole 68 is formed in dielectric layer 62 to provide interconnection between the fourth polysilicon layer and the second polysilicon layer, or more specifically between the load transistor gates 64 and landing pads 44. To accommodate for the interconnection between the second and fourth polysilicon layers, openings 48 are also provided in the third polysilicon layer or $V_{cc}$ bus layer.

While the structure and layout of a memory cell in accordance with the present invention have been described with reference to FIGS. 2A-2D and 3A-3C, it will be helpful to relate the figures to the circuit diagram illustrated in FIG. 1 in order to fully understand the advantages of the present invention. As mentioned earlier, a major advantage of the invention is that the invention provides a substantially reduced memory cell area over existing cell designs and layouts. The area reduction is primarily attributable to two factors: the use of vertical thin-film load transistors and the highly compact nature of the interconnects between various layers and transistor electrodes. The vertical load transistors are illustrated in FIG. 3C and described in detail in the earlier referenced co-pending patent application. The compact interconnect structure is outlined below.

As seen in FIG. 1, a six transistor memory cell has two nodes, each node having five associated interconnects. NODE 1 interconnects include the drain of latch transistor 14, one current electrode of transfer transistor 10, the drain of load transistor 18, the gate of load transistor 20, and the gate of latch transistor 16. NODE 2 is the cmoplement of NODE 1 and includes interconnects between the drain of latch transistor 16, the gate of latch transistor 14, the gate of load transistor 18, the drain of load transistor 20, and one current electrode of transfer transistor 12.

One of the challenges facing memory cell manufacturers is to include all ten of these interconnections (five per node) in as small an area as possible. The present invention succeeds in meeting this challange because four of the interconnections associated with each node are located within an area defined by a minimum feature. For the purposes of this invention, the minimum features are considered to be either through-holes 46 or trenches 60. In FIGS. 2D, 3A, and 3B, it is apparent that through-holes 46 are smaller than trenches 60. Therefore, through-holes 46 are the minimum features of the illustrated memory device and layout. However, it is important to note that through-holes 46 are not required to be smaller than trenches 60. If through-holes 46 are not smaller than trenches 60, then trenches 60 constitute the minimum features. The remaining discussion of interconnections in a memory cell in accordance with the present invention focuses on trenches 60 as the minimum features. But keep in mind that alternatively through-holes 46 may be the minimum features, as illustrated herein.

Referring to FIG. 3A and FIG. 1, it is apparent that four interconnections associated with NODE 1 are located within or directly beneath trench 60 which may be the minimum feature of the cell. Working from the substrate upward, one interconnection within NODE 1 is a current electrode of transfer transistor 10. This interconnect is achieved through buried contact 34, which lies directly under trench 60, to a current electrode 40 of a latch transistor having a control electrode or gate labeled as first polysilicon region 38. A second interconnection lying beneath trench 60 is the gate of latch transistor 16 which is illustrated in FIG. 3A as first polysilicon region 36. A third interconnect in NODE 1 is the drain electrode of the vertical TFT load transistor 18. The drain of the load transistor is the doped polysilicon region within trench 60 which is in contact with landing pad 44. Note that each of these interconnections also exists within an enclosed area defined by through-hole 46, an alternative to trench 60 as the minimum feature size.

A fourth interconnect of NODE 1 is more clearly understood with reference to the layout of the memory cell illustrated in FIG. 2D. A portion of active region 30 lies within trench 60 located at NODE 1. The active region extends to the right and intersects the rightmost first polysilicon region 36. The rightmost first polysilicon layer 36 is a control electrode for latch transistor 14. On each side of the control electrode of the transistor, current electrodes are formed by active region 30. Therefore, the fourth interconnect of the NODE 1 is a current electrode of the latch transistor 14, namely the drain of the transistor, which is achieved through active region 30.

All four of the interconnections of NODE 1 within trench 60 can also be seen in the layout of FIG. 2D. Almost every layer of the cell is contained in part within trench 60 so that most interconnects can be located in this area of the cell. The layers within the trench area include active region layer 30, buried contact layer 34, first polysilicon layer 36, second polysilicon layer 44, the through-hole layer 46 which interconnects first and second polysilicon, the third polysilicon layer (illustrated in a negative image in FIG. 2C), the fourth polysilicon layer 64, and the through-hole layer 68 which interconnects the second and fourth polysilicon layers.

Four interconnects are also contained within or beneath the trench associated with NODE 2 as illustrated in FIG. 3B. NODE 2 is simply the complement of NODE 1 and a discussion of the interconnects of NODE 2 is similar to the discussion relating to NODE 1 interconnects and therefore is not included.

While four interconnects associated with each node are confined to an area defined by a minimum feature, namely by one of the trenches 60 or one of the through-holes 46, all ten of the interconnects in the memory cell are contained in the combined enclosed areas of both trenches or both through-holes. Using trenches 60 as the minimum features as done earlier, four interconnects of NODE 1 are contained within or lie beneath the trench associated with that node. A fifth interconnect of NODE 1 is contained within the trench associated with NODE 2. Similarly, a fifth interconnect of NODE 2 is contained within the trench associated with NODE 1. From FIG. 1, the interconnects not mentioned thus far, i.e. the fifth interconnect of each node, are contacts to the control electrode of gate of the vertical load transistors. As seen from FIG. 3A, the control electrode 64 of vertical load transistor 18 is contained within trench 60. However according to FIG. 1, control electrode 64 of transistor 18 is an interconnect at NODE 2 rather than NODE 1. Therefore, to couple control electrode 64 to NODE 2 of the memory cell, the electrode extends across dielectric layer 62 and through through-hole 68, contacting polysilicon landing pad 44. As FIG. 2D illustrates, landing pad 44 extends into NODE 2, thereby interconnecting the gate of load transistor 18 to NODE 2. Similarly, the gate of load transistor 20 is coupled to NODE 1 via one of the conductive landing pads 44. Thus, the fifth interconnect of NODE 1 is achieved through the landing pad 44 contained within the trench associated with NODE 2.

As the above discussion points out, the present invention has a very compact interconnect structure which results in a substantial reduction in memory cell area. While four interconnects associated with one of two nodes in the memory cell are contained within an area defined by a minimum feature, all ten interconnects of the cell are contained within two such areas. The use of vertical thin-film load transistors also attributes to a very small cell area. A cell in accordance with the present invention may be 30-40% smaller than existing 6T memory cells which also utilize thin-film transistors.

Thus it is apparent that there has been provided, in accordance with the invention, an integrated circuit memory device and structural layout thereof that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, conductive materials used in a device in accordance with the invention are not limited to polysilicon, but may be amorphous silicon, germanium, gallium arsenide, diamond, or other materials used as conducting or semiconducting layers within the semiconductor art. Likewise, the semiconductor device of the present invention is not limited to use in SRAM memory devices. The invention is suitable for use with any memory device or digital circuit incorporating transistors. Another variation to the teachings of the present invention may be to implement the interconnect structure taught previously in a memory device which utilizes vertical load resistors rather than vertical load transistors. In addition, the present invention may also be used in bipolar devices and is not restricted to CMOS applications. It is also important to note that the present invention is not limited in any way to specific materials or deposition, growth, or etching techniques used to form a device in accordance with the invention. Furthermore, a minimum feature of the present invention may be either a trench or a through-hole as described herein. Therefore, it is intended that this invention encompass all such variations and modifications as fall within the scope of the appended claims.

I claim:

1. An integrated circuit memory device having a plurality of cells, each cell comprising:
   first and second latch transistors, each latch transistor having a control electrode and first and second current electrodes;
   first and second transfer transistors, each transfer transistor having a control electrode and first and second current electrodes;
   first and second vertical load transistors, each load transistor being positioned within a substantially vertical wall trench and having a first current electrode located adjacent a bottom surface of the trench, a second current electrode, a channel region along the substantially vertical wall of the trench which connects the first and second current electrodes, and a control electrode contained within the trench;
   a first data storage node which electrically connects the first current electrode of the first transfer transistor, the first current electrode of the first latch transistor, the control electrode of the second latch transistor, the control electrode of the second vertical load transistor, and the first current electrode of the first vertical load transistor;
   a second data storage node which electrically connects the first current electrode of the second transfer transistor, the first current electrode of the second latch transistor, the control electrode of the first latch transistor, the control electrode of the first vertical load transistor, and the first current electrode of the second vertical load transistor; and
   first interconnect means which at least partially underlies the control electrode of the second latch transistor and which electrically connects the control electrode of the second latch transistor to the first current electrode of the first transfer transistor.

2. The memory device of claim 1 wherein the first and second current electrodes and the channel regions of the first and second vertical load transistors are comprised of polysilicon.

3. The memory device of claim 1 further comprising second interconnect means which at least partially underlies the control electrode of the first vertical load transistor and which electrically connects the first current electrode of the first vertical load transistor to the control electrode of the second latch transistor.

4. The memory device of claim 3 wherein the second interconnect means comprises a conductive landing pad.

5. The memory device of claim 4 wherein the conductive landing pad is comprised of polysilicon.

6. The memory device of claim 1 wherein the first interconnect means is a buried contact.

7. The memory device of claim 1 wherein the first interconnect means is a strapped local interconnect.

8. A structural layout for an integrated circuit memory device having an array of memory cells, at least one cell having a plurality of transistors and at least one data storage node, a minimum feature, and an enclosed area defined by a perimeter of the minimum feature, the enclosed area of the layout comprising:
   an active region which functions as a current electrode of a first transistor;
   first interconnect means within a portion of the active region;
   a first conductive material forming a control electrode of a second transistor and overlapping a portion of the first interconnect means to electrically couple the control electrode of the second transistor to the active region;
   second interconnect means overlapping a portion of the first conductive material;
   a second conductive material overlapping the second interconnect means, the second conductive material functioning as current electrodes of a third transistor; and
   a third conductive material forming a control electrode of the third transistor and contained within the second interconnect means.

9. The structural layout of claim 8 wherein the enclosed area further comprises:
   third interconnect means overlapping a portion of the control electrode of the second transistor; and
   a fourth conductive material overlapping the third interconnect means to electrically couple the fourth conductive material, the second conductive material, and the control electrode of the second transistor.

10. The structural layout of claim 9 wherein the first conductive material, second conductive material, third conductive material, and fourth conductive material are comprised of polysilicon.

11. The structural layout of claim 8 wherein the first transistor functions as a transfer transistor, the second transistor functions as a latch transistor, and the third transistor functions as a load transistor in an SRAM cell.

12. The structural layout of claim 8 wherein the first interconnect means is a buried contact formed in a substrate.

13. The structural layout of claim 8 wherein the first interconnect means is a strapped local interconnect.

14. A structural layout for an integrated circuit memory device having an array of memory cells, at least one cell having a plurality of transistors and first and second data storage nodes, each data storage node having a minimum feature and an enclosed area defined by a perimeter of the minimum feature, the enclosed area of the first data storage node of the layout comprising:
   an active region which functions as a current electrode of a first transistor;
   first interconnect means within a portion of the active region;
   a first conductive material forming a control electrode of a second transistor and overlapping a portion of the first interconnect means to electrically couple the control electrode of the second transistor to the active region;
   second interconnect means overlapping a portion of the control electrode of the second transistor;
   a second conductive material overlapping the second interconnect means to electrically couple the second conductive material to the control electrode of the second transistor;
   third interconnect means overlapping a portion of the second conductive material;
   a third conductive material overlapping the third interconnect means to electrically couple the third conductive material to the second conductive material, the third conductive material functioning as current electrodes of a third transistor; and
   a fourth conductive material forming a control electrode of the third transistor and contained within the third interconnect means; and
   a fourth interconnect means located outside the enclosed area of the first data storage node but contained within the at least one cell, the fourth interconnect means connecting the control electrode of the third transistor to the second data storage node.

15. The structural layout of claim 14 wherein the enclosed area of the second data storage node has a layout substantially identical to the enclosed area of the first data storage node, a second conductive material of the second data storage node being coupled to the control electrode of the third transistor of the first data storage node by the fourth interconnect means.

16. The structural layout of claim 15 wherein the first conductive material, second conductive material, third conductive material, and fourth conductive material are comprised of polysilicon.

17. The structural layout of claim 15 wherein the first transistor functions as a transfer transistor, the second transistor functions as a latch transistor, and the third transistor functions as a load transistor in an SRAM cell.

18. The structural layout of claim 17 wherein the third transistor is a vertically oriented thin-film transistor.

19. The structural layout of claim 15 wherein the third interconnect means is a trench formed in a dielectric material.

20. The structural layout of claim 15 wherein the third conductive material also functions as $V_{cc}$ of the memory device.

21. The structural layout of claim 8 wherein the second interconnect means is a trench formed in a dielectric material.

22. The structural layout of claim 8 wherein the second interconnect means is a through-hole formed in a dielectric material.

23. The structural layout of claim 8 wherein the third transistor is a vertically oriented thin-film transistor.

24. The structural layout of claim 8 wherein the third conductive material also functions as $V_{cc}$ of the integrated circuit memory device.

25. The structural layout of claim 15 wherein the first interconnect means is a buried contact formed in a substrate.

* * * * *